(12) United States Patent
Wang et al.

(10) Patent No.: US 10,026,745 B1
(45) Date of Patent: Jul. 17, 2018

(54) SEMICONDUCTOR MEMORY CELL STRUCTURE

(71) Applicant: UNITED MICROELECTRONICS CORP., Hsin-Chu (TW)

(72) Inventors: Han Wang, Singapore (SG); Xian Feng Du, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/405,324

(22) Filed: Jan. 13, 2017

(51) Int. Cl.
*H01L 27/11568* (2017.01)
*H01L 29/792* (2006.01)
*H01L 29/49* (2006.01)

(52) U.S. Cl.
CPC .... *H01L 27/11568* (2013.01); *H01L 29/4916* (2013.01); *H01L 29/792* (2013.01)

(58) Field of Classification Search
CPC ............... H01L 29/792; H01L 29/4916; H01L 27/11568
See application file for complete search history.

(56) References Cited

U.S. PATENT DOCUMENTS

| | | | |
|---|---|---|---|
| 8,940,645 B2 | 1/2015 | Ramkumar et al. | |
| 8,993,457 B1 * | 3/2015 | Ramkumar | H01L 21/0223 438/763 |
| 9,105,740 B2 | 8/2015 | Puchner et al. | |
| 9,331,184 B2 * | 5/2016 | Yang | H01L 29/66833 |
| 2008/0272424 A1 * | 11/2008 | Kim | H01L 21/28282 257/321 |
| 2011/0101442 A1 * | 5/2011 | Ganguly | H01L 21/28282 257/324 |
| 2013/0306975 A1 * | 11/2013 | Levy | H01L 21/28282 257/66 |
| 2017/0005108 A1 * | 1/2017 | Byun | H01L 22/26 |
| 2017/0092729 A1 * | 3/2017 | Polishchuk | H01L 29/4234 |

* cited by examiner

*Primary Examiner* — Christine Enad
(74) *Attorney, Agent, or Firm* — Winston Hsu

(57) ABSTRACT

A semiconductor memory cell structure includes a substrate, a tunnel dielectric layer formed on the substrate, a blocking dielectric layer formed on the substrate, a control gate formed on the blocking dielectric layer, and a tri-layered charge-trapping layer sandwiched between the tunnel dielectric layer and the blocking dielectric layer. Furthermore, the tri-layered charge-trapping layer includes a bottom nitride layer formed on the substrate, a top nitride layer formed on the bottom nitride layer, and a middle nitride layer sandwiched between the bottom nitride layer and the top nitride layer. The bottom nitride layer includes a first nitride concentration, the top nitride layer includes a second nitride concentration, and the middle nitride layer includes a third nitride concentration. And the third nitride concentration is larger than the first nitride concentration and the second nitride concentration.

23 Claims, 4 Drawing Sheets

SEMICONDUCTOR MEMORY CELL STRUCTURE

BACKGROUND OF THE INVENTION

1. Field of the Invention

The invention relates to a semiconductor memory cell structure, and more particularly, to a silicon-oxide-nitride-oxide-semiconductor (hereinafter abbreviated as SONOS) memory cell structure.

2. Description of the Prior Art

Semiconductor memory devices are prevalently used in computer and electronics industries as a means for retaining digital information. Typically, the semiconductor memory devices are divided into volatile and non-volatile memory devices depending on whether the data stored in the memory devices is completely lost or not in case of power interruption. And the non-volatile memory devices, which can retain their data even when the power supply is interrupted, have been widely employed.

In the conventional non-volatile memory technology, a silicon-oxide-nitride-oxide-semiconductor (SONOS) memory structure is to build a silicon nitride layer sandwiched between two silicon oxide layers for serving as the charge trap layer while the two silicon oxide layers respectively serve as a charge tunnel layer and a charge block layer. This oxide-nitride-oxide (hereinafter abbreviated as ONO) multilayered structure is further formed between a semiconductor substrate and a silicon control gate, and thus a SONOS memory structure is constructed.

In operation, a high electric field is induced thus electrons or holes are accelerated and injected into the oxide charge tunnel layer from the source. The nitride charge trap layer traps the electrons or holes that penetrate through the charge tunnel layer. And the oxide charge block layer prevents the electrons or holes that escape the charge trap layer from reaching the silicon during program or erase operations.

When erasing information recorded in the SONOS memory structure, an electric field, in an opposite direction to that used when programming, is formed by applying a predetermined voltage to the gate after the substrate is grounded. Accordingly, the electrons or holes are removed from the charge tunnel layer and back to the drain.

It is therefore concluded that the charge capture/trapping ability of the nitride charge trap layer plays an important role in the SONOS memory structure.

SUMMARY OF THE INVENTION

According to an aspect of the present invention, a semiconductor memory cell structure is provided. The semiconductor memory cell structure includes a substrate, a tunnel dielectric layer formed on the substrate, a blocking dielectric layer formed on the substrate, a control gate formed on the blocking dielectric layer, and a tri-layered charge-trapping layer sandwiched between the tunnel dielectric layer and the blocking dielectric layer. Furthermore, the tri-layered charge-trapping layer includes a bottom nitride layer formed on the substrate, a top nitride layer formed on the bottom nitride layer, and a middle nitride layer sandwiched between the bottom nitride layer and the top nitride layer. The bottom nitride layer includes a first nitride concentration, the top nitride layer includes a second nitride concentration, and the middle nitride layer includes a third nitride concentration. And the third nitride concentration is larger than the first nitride concentration and the second nitride concentration.

According to another aspect of the present invention, an ONO structure for a semiconductor memory cell is provided. The ONO structure for the semiconductor memory cell includes a tunnel oxide layer, a blocking oxide layer, a top nitride layer and a bottom nitride layer sandwiched between the tunnel oxide layer and the blocking oxide layer, and a charge-trapping nitride layer sandwiched between the top nitride layer and the bottom nitride layer. More important, the charge-trapping nitride layer is different from the top nitride layer and the bottom nitride layer.

According to the present invention, the tri-layered charge-trapping layer includes the middle nitride layer different from the top and bottom nitride layers, thus a saddle-shaped energy band is constructed by the ONO structure (including the tunnel dielectric layer, the tri-layered charge-trapping layer and the blocking dielectric layer). More important, the saddle-shaped energy band of the ONO structure provided by the present invention improves the charge capture/trapping ability of the tri-layered charge-trapping layer and boosts the data retention and the end of life (EoL) memory window.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Figure 1:
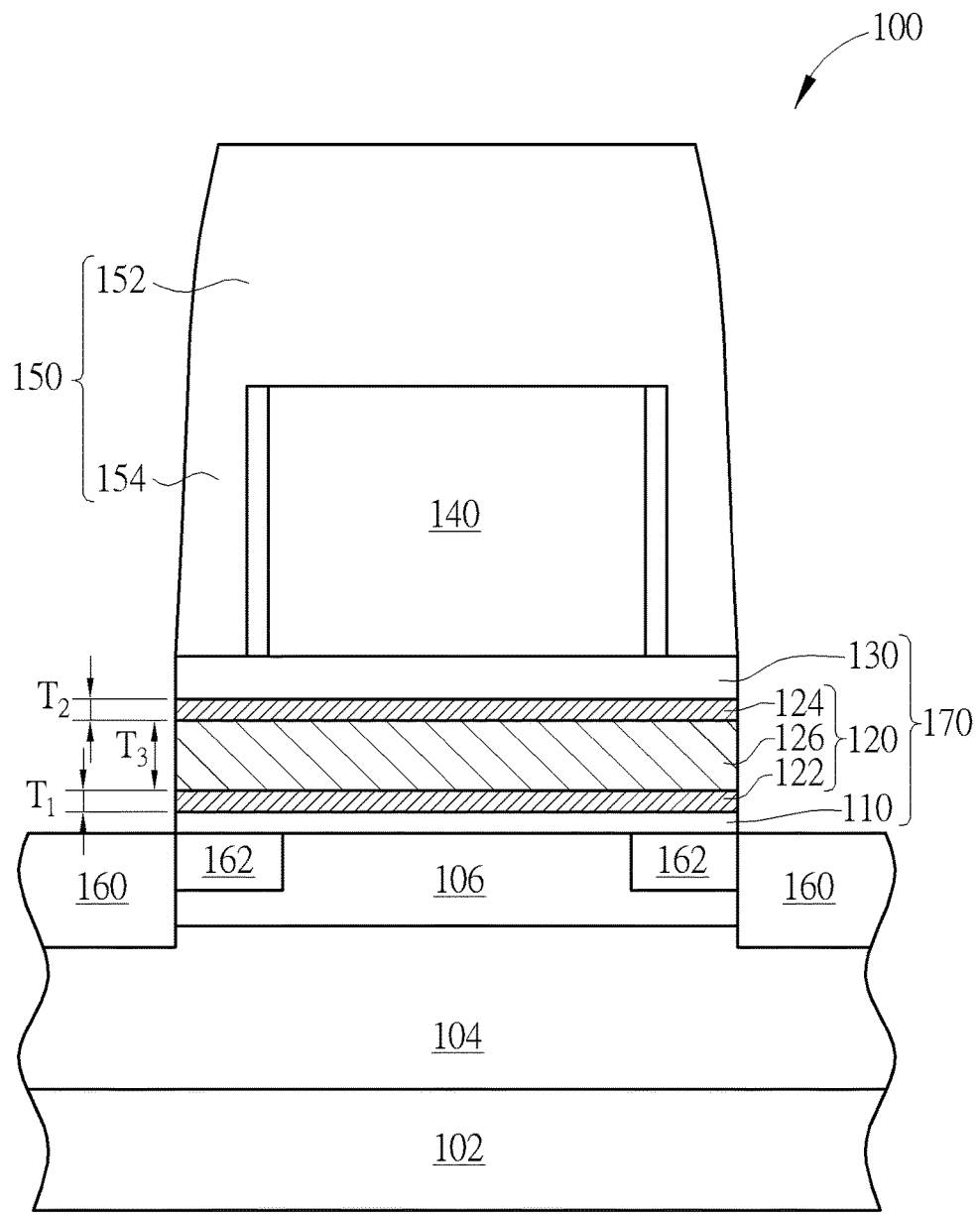
FIG. 1 is a schematic drawing illustrating a semiconductor memory cell structure provided by a first preferred embodiment of the present invention.

Please refer to FIG. 1, which is a schematic drawing illustrating a semiconductor memory cell structure provided by a first preferred embodiment of the present invention. As shown in FIG. 1, the semiconductor memory cell structure 100 includes a substrate 102. The substrate 102 includes any material suitable for semiconductor device fabrication. In some embodiments, the substrate 102 includes a bulk substrate of a single crystal of a material which may include, for example but not limited to, silicon (Si), germanium (Ge), SiGe, or an III-V compound semiconductor material. In other embodiments, the substrate 102 includes a bulk layer with a top epitaxial layer. Instill other embodiments, the substrate 102 includes a top epitaxial layer on an insulator layer which is above a lower bulk layer. The top epitaxial layer may include, for example but not limited to, Si, Ge, SiGe, or an III-V compound semiconductor material. The insulator layer may include, for example but not limited to silicon oxide (SiO), silicon nitride (SiN) or silicon oxynitride (SiON). And the lower bulk layer may include, for example but not limited to, Si, Ge, SiGe, or an III-V compound semiconductor material. As shown in FIG. 1, a well region 104 is formed in the substrate 102. The substrate 102 can include a first conductivity type and the well region 104 can include a second conductivity type, and the first conductivity type and the second conductivity type are complementary to each other. For example but not limited to, the first conductivity type is an n type and the second conductivity type is a p type in accordance with the preferred embodiment.

The semiconductor memory cell structure 100 further includes a tunnel dielectric layer 110 formed on the substrate 102, a blocking dielectric layer 130 formed on the substrate 102 and the tunnel dielectric layer 110, a control gate 140 formed on the blocking dielectric layer 130, and a tri-layered charge-trapping layer 120 sandwiched between the tunnel dielectric layer 110 and the blocking dielectric layer 130. And the tunnel dielectric layer 110, the tri-layered charge-trapping layer 120, the blocking dielectric layer 130 and the control gate 140 are defined by a protecting layer 150 including a cap layer 152 formed on a top of the control gate 140 and a spacer 154 formed sidewalls of the control gate 140. The protecting layer 150 is formed to cover the control gate 140, the blocking dielectric layer 130, the tri-layered charge-trapping layer 120, and the tunnel dielectric layer 110, and to protect those layers from damage that may be caused in any process such as photolithograph process, ion implantation, etching process, or any needed cleaning process in the semiconductor fabricating process. As shown in FIG. 1, the semiconductor memory cell structure 100 further includes a source/drain region 160 and lightly-doped drains (LDDs) 162 formed in the substrate 102 at two sides of the control gate 140. According to the preferred embodiment, the source/drain region 160 and the LDDs 162 includes the first conductivity type. Accordingly, a channel region 106 is defined between the source/drain regions 160.

According to the preferred embodiment, the tunnel dielectric layer 110 and the blocking dielectric layer 130 preferable include SiO, but not limited to this. In other words, the semiconductor memory cell structure 100 can include a tunnel oxide layer 110 and a blocking oxide layer 130 stacked on the substrate 102 as shown in FIG. 1. A thickness of the tunnel dielectric layer 110 is suitable to allow charge carriers to tunnel into under an applied gate bias while maintaining a suitable barrier to leakage when the device is unbiased. A thickness of the blocking dielectric layer 130 is suitable maintain a barrier to charge leakage without significantly decreasing the capacitance of gate stack. The thickness of the tunnel dielectric layer 110 and the thickness of the blocking dielectric layer 130 can be different. In some embodiments of the present invention, the tunnel dielectric layer 110 and the blocking dielectric layer 130 can be formed by chemical vapor deposition (CVD) or atomic layer deposition (ALD), respectively. In some embodiments of the present invention, the tunnel dielectric layer 110 can be formed by thermal oxidation, but not limited to this.

The control gate 140 can include a conductor or a semiconductor material suitable for accommodating a bias during operation of the semiconductor memory cell structure 100. In some embodiments of the present invention, the control gate 140 can include semiconductor material such as polysilicon, but not limited to this. In other embodiments of the present invention, the control gate 140 can include conductor material such as metal-maintaining material.

Please still refer to FIG. 1. The tri-layered charge-trapping layer 120 of the semiconductor memory cell structure 100 further includes a bottom nitride layer 122 formed on the substrate 102 and the tunnel dielectric layer 110, a middle nitride layer 126 formed on the bottom nitride layer 122, and a top nitride layer 124 formed on the middle nitride layer 126. In other words, the top nitride layer 122 and the bottom nitride layer 124 are sandwiched between the tunnel oxide layer 110 and the blocking oxide layer 130 while the middle nitride layer 126 is sandwiched between the bottom nitride layer 122 and the top nitride layer 124. Since there is the tri-layered charge-trapping nitride layer 120 sandwiched between the tunnel oxide layer 110 and the blocking oxide layer 130, the preferred embodiment provides an ONO structure 170 for the semiconductor memory cell structure 100. Furthermore, since the ONO structure 170 is sandwiched between the control gate 140 and the substrate 102, a SONOS-type memory cell structure 100 is constructed.

Please still refer to FIG. 1. In the tri-layered charge-trapping layer 120, the middle nitride layer 126 is different from the bottom nitride layer 122 and the top nitride layer 124. In some embodiments of the present invention, the bottom nitride layer 122 includes a first thickness $T_1$, the top nitride layer 124 include a second thickness $T_2$, the middle nitride layer 126 includes a third thickness $T_3$, and the third thickness $T_3$ is larger than the first thickness $T_1$ and the second thickness $T_2$. In some embodiments of the present invention, the third thickness $T_3$ and a sum of the first thickness $T_1$ and the second thickness $T_2$ include a ratio, and the ratio is larger than 7:3. In detail, a ratio of the first thickness $T_1$, the third thickness $T_3$ and the second thickness $T_2$ can be 1.5:7:1.5, but not limited to this. In other embodiments of the present invention, the ratio of the third thickness $T_3$ and the sum of the first thickness $T_1$ and the second thickness $T_2$ can be 8:2. In detail, the ratio of the first thickness $T_1$, the third thickness $T_3$ and the second thickness $T_2$ can be 1:8:1, but not limited to this. Additionally, the first thickness $T_1$ and the second thickness $T_2$ are the same, but not limited to this. In some embodiments of the present invention, the bottom nitride layer 122 includes a first nitride concentration, the top nitride layer 124 includes a second nitride concentration, and the middle nitride layer 126 includes a third nitride concentration. The first/second/third nitride concentration is referred to the concentration of $Si_3N_4$ in the layers. Therefore, in the case that the nitride concentration of a layer is about 100%, it is taken as the layer includes 100% nitride is a pure $Si_3N_4$ layer. And in the case that the nitride concentration of a layer is lower than 100%, it is taken as the layer includes not only SiN, but also other compounds such as SiON, but not limited to this. In the preferred embodiment, the third nitride concentration is larger than the first nitride concentration and the second nitride concentration while the first nitride concentration and the second nitride concentration are the same. For example but not limited to, the third nitride concentration is about 100% while the first nitride concentration and the second nitride concentration are between 30% and 50%. Additionally, the first nitride concentration and the second nitride concentration can be graded, but not limited to this. The nitride concentration difference between the middle nitride layer 126 and the top/bottom nitride layers 124/122 can be achieved by adjusting process parameter to fabricate the nitride layers, therefore those details are omitted in the interest of brevity.

Figure 2:
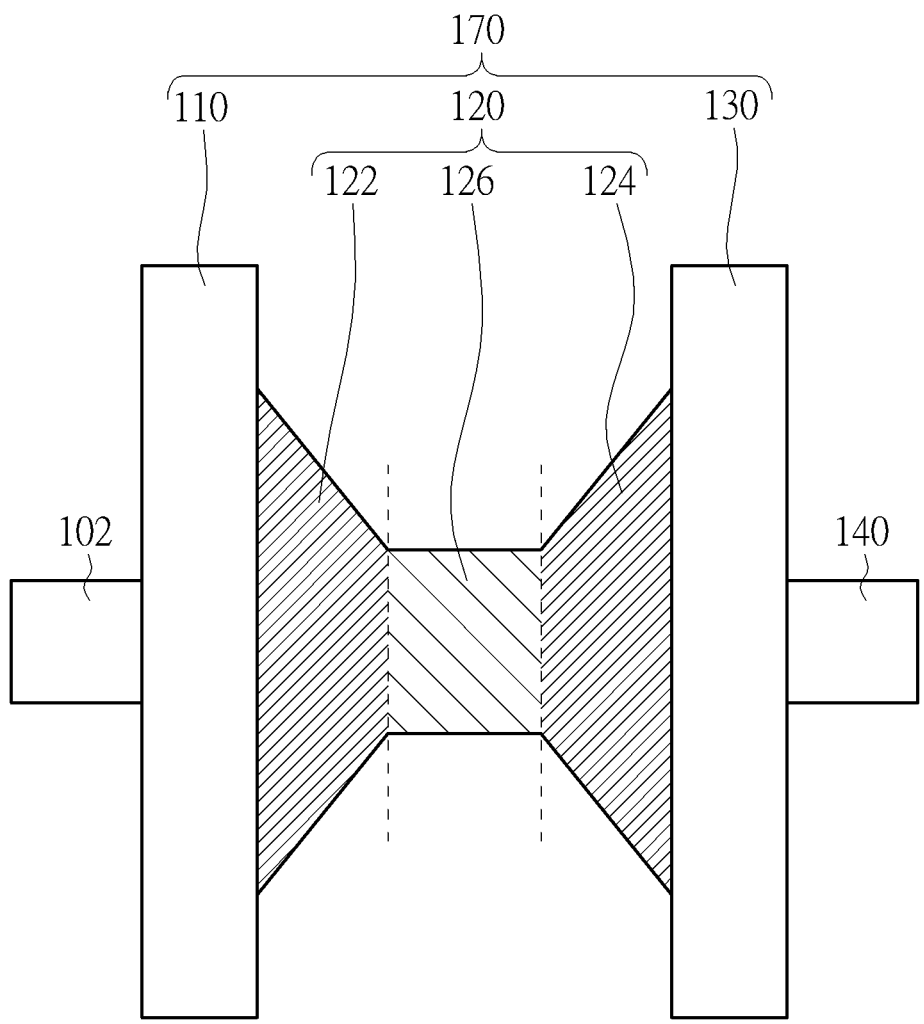
FIG. 2 is an energy band diagram of an ONO structure of the semiconductor memory cell structure provided by the first preferred embodiment of the present invention.

Please refer to FIG. 2, which is an energy band diagram of an ONO structure of the semiconductor memory cell structure provided by the first preferred embodiment of the present invention. As shown in FIG. 2, the band gaps of the tunnel dielectric layer 110 and the blocking dielectric layer 130 is larger than 9 eV, the band gaps of the top and bottom nitride layer 124/122 are between 5.1 eV and 8.5 eV, and the band gap of the middle nitride layer 126 is about 5.1 eV. It is concluded that the offset between the middle nitride layer 126 and the tunnel/blocking dielectric layer 110/130 serves as a barrier that hinders charge leakage. Therefore, the charges are captured and trapped deeply in the middle nitride layer 126, and the middle nitride layer 126 is referred to as a strong charge-trapping nitride layer sandwiched between the top nitride layer 124 and the bottom nitride layer 122. Furthermore, since the distance between the middle nitride layer 126 and the tunnel dielectric layer 110 and the distance between the middle nitride layer 126 and the blocking dielectric layer 130 is relatively larger, the tunnel distance is lengthened and thus possibility of charge back tunneling is decreased, and thus data retention and end of life (EoL) memory window are improved.

According to the present invention, the tri-layered charge-trapping layer 120 includes the middle nitride layer 126 different from the top and bottom nitride layers 124/122 and serving as the main charge-trapping element, thus a saddle-shaped energy band is formed by the ONO structure 170 (including the tunnel dielectric layer 110, the tri-layered charge-trapping layer 120 and the blocking dielectric layer 130). More important, the saddle-shaped energy band of the ONO structure 170 provided by the present invention improves the charge capture/trapping ability of the tri-layered charge-trapping layer 120 and improves the data retention and EoL) memory window of the semiconductor memory cell structure 100.

Figure 3:
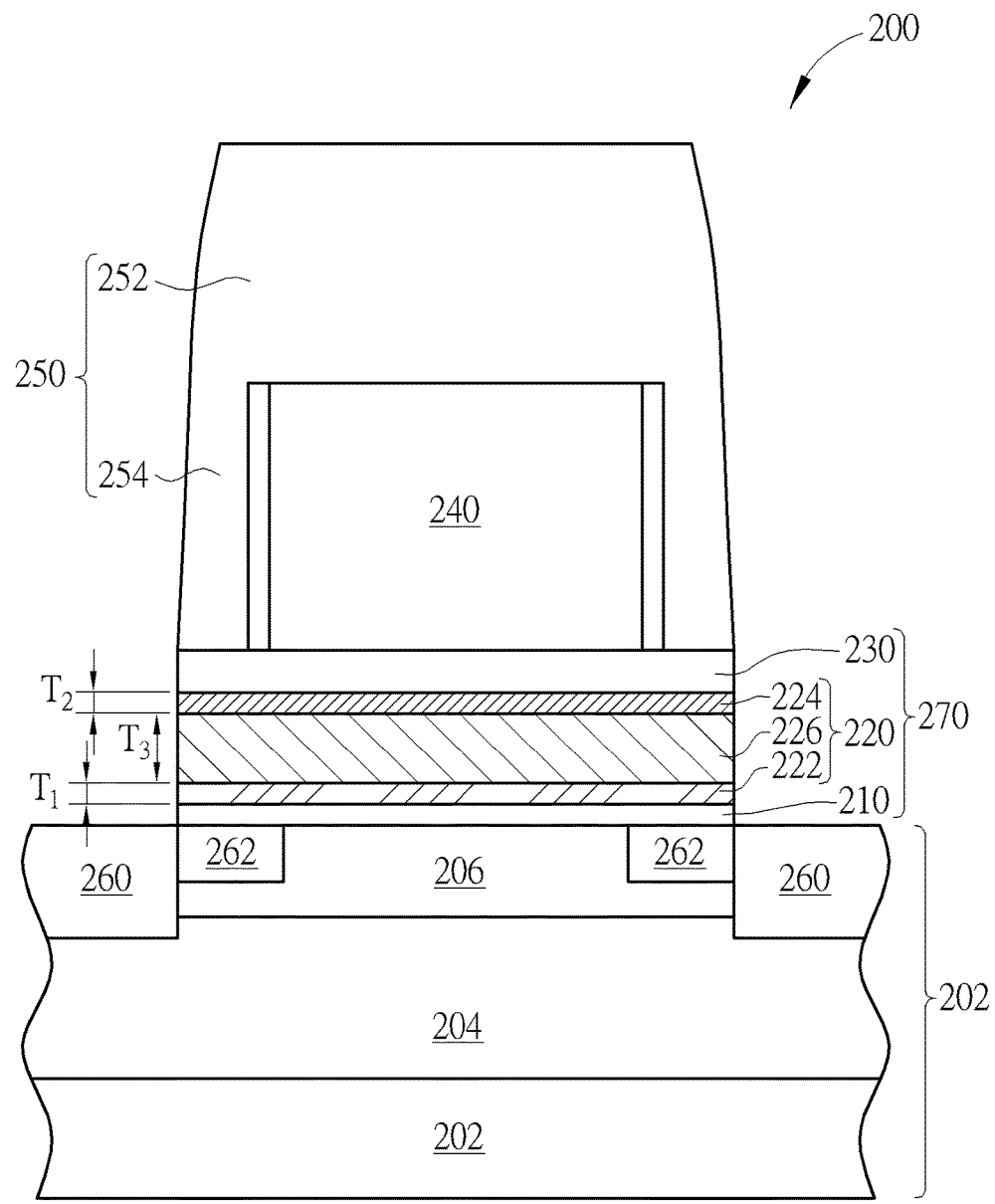
FIG. 3 is a schematic drawing illustrating a semiconductor memory cell structure provided by a second preferred embodiment of the present invention.

Please refer to FIG. 3, which is a schematic drawing illustrating a semiconductor memory cell structure provided by a second preferred embodiment of the present invention. It should be understood that elements the same in both of the first and second embodiments can include the same material(s), and thus those details are omitted for simplicity. As shown in FIG. 3, the semiconductor memory cell structure 200 includes a substrate 202, and a well region 204 is formed in the substrate 202. The substrate 202 can include a first conductivity type and the well region 204 can include a second conductivity type, and the first conductivity type and the second conductivity type are complementary to each other. For example but not limited to, the first conductivity type is an n type and the second conductivity type is a p type in accordance with the preferred embodiment.

The semiconductor memory cell structure 200 further includes a tunnel dielectric layer 210 formed on the substrate 202, a blocking dielectric layer 230 formed on the substrate 202 and the tunnel dielectric layer 210, a control gate 240 formed on the blocking dielectric layer 230, and a tri-layered charge-trapping layer 220 sandwiched between the tunnel dielectric layer 210 and the blocking dielectric layer 230. And the tunnel dielectric layer 210, the tri-layered charge-trapping layer 220, the blocking dielectric layer 230 and the control gate 240 are defined by a protecting layer 250 including a cap layer 252 formed on a top of the control gate 240 and a spacer 254 formed sidewalls of the control gate 240. The protecting layer 250 is formed to cover the control gate 240, the blocking dielectric layer 230, the tri-layered charge-trapping layer 220, and the tunnel dielectric layer 210, and to protect those layers from damage that may be caused in any process such as photolithograph process, ion implantation, etching process, or any needed cleaning process in the semiconductor fabricating process. As shown in FIG. 3, the semiconductor memory cell structure 200 further includes a source/drain region 260 and LDDs 262 formed in the substrate 202 at two sides of the control gate 240. According to the preferred embodiment, the source/drain region 260 and the LDDs 262 includes the first conductivity type. Accordingly, a channel region 206 is defined between the source/drain regions 260.

According to the preferred embodiment, the tunnel dielectric layer 210 and the blocking dielectric layer 230 preferable include SiO, but not limited to this. In other words, the semiconductor memory cell structure 200 can include a tunnel oxide layer 210 and a blocking oxide layer 230 stacked on the substrate 202 as shown in FIG. 3. A thickness of the tunnel dielectric layer 210 is suitable to allow charge carriers to tunnel into under an applied gate bias while maintaining a suitable barrier to leakage when the device is unbiased. A thickness of the blocking dielectric layer 230 is suitable maintain a barrier to charge leakage without significantly decreasing the capacitance of gate stack. The thickness of the tunnel dielectric layer 210 and the thickness of the blocking dielectric layer 230 can be different. The method for forming the tunnel dielectric layer 210 and the blocking dielectric layer 230 can be the same with those provided in the first preferred embodiment, therefore those details are omitted for simplicity.

The control gate 240 can include a conductor or a semiconductor material suitable for accommodating a bias during operation of the semiconductor memory cell structure 200. In some embodiments of the present invention, the control gate 240 can include semiconductor material such as polysilicon, but not limited to this. In other embodiments of the present invention, the control gate 240 can include conductor material such as metal-maintaining material.

Please still refer to FIG. 3. The tri-layered charge-trapping layer 220 of the semiconductor memory cell structure 200 further includes a bottom nitride layer 222 formed on the substrate 202 and the tunnel dielectric layer 210, a middle nitride layer 226 formed on the bottom nitride layer 222, and a top nitride layer 224 formed on the middle nitride layer 226. In other words, the top nitride layer 224 and the bottom nitride layer 222 are sandwiched between the tunnel oxide layer 210 and the blocking oxide layer 230 while the middle nitride layer 226 is sandwiched between the bottom nitride layer 222 and the top nitride layer 224. Since there is the nitride tri-layered charge-trapping layer 220 sandwiched between the tunnel oxide layer 210 and the blocking oxide layer 230, the preferred embodiment provides an ONO structure 270. Furthermore, since the ONO structure 270 is sandwiched between the control gate 240 and the substrate 202, a SONOS-type memory cell structure 200 is constructed.

Please still refer to FIG. 3. In the tri-layered charge-trapping layer 220, the middle nitride layer 226 is different from the bottom nitride layer 222 and the top nitride layer 224. In some embodiments of the present invention, the bottom nitride layer 222 includes a first thickness $T_1$, the top nitride layer 224 include a second thickness $T_2$, the middle nitride layer 226 includes a third thickness $T_3$, and the third thickness $T_3$ is larger than the first thickness $T_1$ and the second thickness $T_2$. In some embodiments of the present invention, the third thickness $T_3$ and a sum of the first thickness $T_1$ and the second thickness $T_2$ include a ratio, and the ratio is larger than 7:3. In detail, a ratio of the first thickness $T_1$, the third thickness $T_3$ and the second thickness $T_2$ can be 1.5:7:1.5, but not limited to this. In other embodiments of the present invention, the ratio of the third thickness $T_3$ and the sum of the first thickness $T_1$ and the second thickness $T_2$ can be 8:2. In detail, the ratio of the first thickness $T_1$, the third thickness $T_3$ and the second thickness $T_2$ can be 1:8:1, but not limited to this. Additionally, the first thickness $T_1$ and the second thickness $T_2$ are the same, but not limited to this. In some embodiments of the present invention, the bottom nitride layer 222 includes a first nitride concentration, the top nitride layer 224 includes a second nitride concentration, and the middle nitride layer 226 includes a third nitride concentration. As mentioned above, the first/second/third nitride concentration is referred to the concentration of $Si_3N_4$ in the layers. Therefore, in the case that the nitride concentration of a layer is about 100%, it is taken as the layer includes 100% nitride is a pure $Si_3N_4$ layer. And in the case that the nitride concentration of another is lower than 100%, it is taken as the layer includes not only SiN, but also other compounds such as SiON, but not limited to this. In the preferred embodiment, the third nitride concentration is larger than the first nitride concentration and the second nitride concentration. For example but not limited to, the third nitride concentration is about 100%. It is noteworthy that in the preferred embodiment, the first nitride concentration of the bottom nitride layer 222 is larger than the second nitride concentration of the top nitride layer 224. For example but not limited to, the first nitride concentration is larger than 50% and the second nitride concentration is between 30% and 50%. Furthermore, the first nitride concentration and the second nitride concentration can be graded, but not limited to this. The nitride concentration difference between the bottom nitride layer 222, the middle nitride layer 226 and the top nitride layers 224 can be achieved by adjusting process parameter to fabricate the nitride layers, therefore those details are omitted in the interest of brevity.

Figure 4:
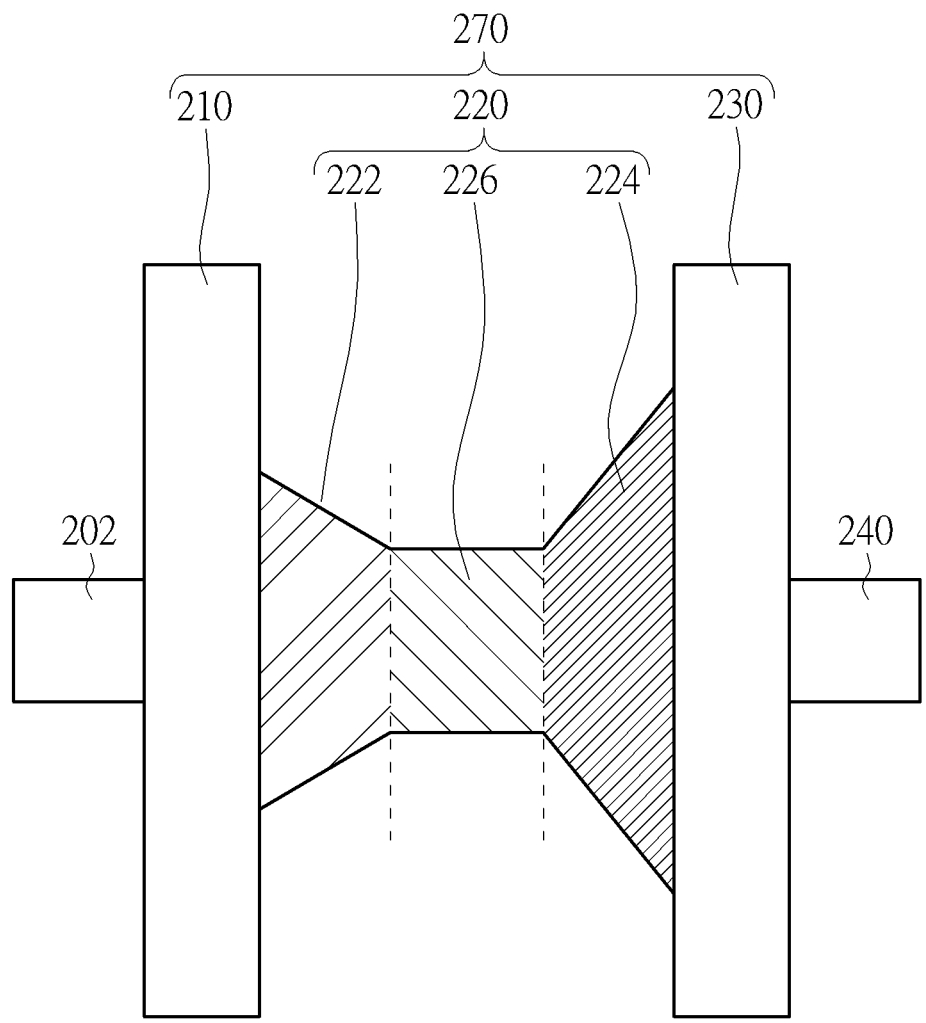
FIG. 4 is an energy band diagram of an ONO structure of the semiconductor memory cell structure provided by the second preferred embodiment of the present invention.

Please refer to FIG. 4, which is an energy band diagram of an ONO structure of the semiconductor memory cell structure provided by the second preferred embodiment of the present invention. As shown in FIG. 4, the band gaps of the tunnel dielectric layer 210 and the blocking dielectric layer 230 is larger than 9 eV, the band gap of the top nitride layer 224 is between 5.1 eV and 8.5 eV, the band gap of the middle nitride layer 226 is about 5.1 eV, and the band gap of the bottom nitride layer 222 is between the that of the top nitride layer 224 and the middle nitride layer 226. It is concluded that the offset between the middle nitride layer 226 and the tunnel/blocking dielectric layer 210/230 serves as a barrier that hinders charge leakage. Accordingly, the charges are captured and trapped deeply in the middle nitride layer 226, and the middle nitride layer 226 is referred to as a strong charge-trapping nitride layer sandwiched between the top nitride layer 224 and the bottom nitride layer 222. Furthermore, since the distance between the middle nitride layer 226 and the tunnel dielectric layer 210 and the distance between the middle nitride layer 226 and the blocking dielectric layer 230 is relatively larger, the tunnel distance is lengthened and thus possibility of charge back tunneling is decreased, and thus data retention and EoL memory window are improved. In the preferred embodiment, since the offset between the bottom nitride layer 222 and the tunnel dielectric layer 210 is larger than that described in the aforementioned preferred embodiment, the possibility of charge back tunneling is further decreased.

According to the preferred embodiment, the tri-layered charge-trapping layer 220 includes the middle nitride layer 226 different from the top and bottom nitride layers 224/222 and serving as the main charge-trapping element, thus a saddle-shaped energy band is constructed by the ONO structure 270 (including the tunnel dielectric layer 210, the tri-layered charge-trapping layer 220 and the blocking dielectric layer 230). More important, the saddle-shaped energy band of the ONO structure 270 provided by the present invention improves the charge capture/trapping ability of the tri-layered charge-trapping layer 220 and improves the data retention and EoL memory window of the semiconductor memory cell structure 200.

According to the present invention, the middle nitride layer in the tri-layered charge-trapping layer serves as the main charge trapping layer. More important, the saddle-shaped energy band of the ONO structure provided by the present invention improves the charge capture/trapping ability of the tri-layered charge-trapping layer and the data retention and EoL memory window of the semiconductor memory cell structure. Furthermore, since the charge capture/trapping ability is improved without adjusting dimension of the semiconductor memory cell structure, the semiconductor memory cell structure provided by the present invention is capable of being scaled down so as to increase device density. Additionally, the semiconductor memory cell structure including the tri-layered charge-trapping layer is compatible with 2T-, 1.5T and 1T-SONOS memory cell structure.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A semiconductor memory cell structure comprising:
    a substrate;
    a tunnel dielectric layer formed on the substrate;
    a blocking dielectric layer formed on the substrate;
    a control gate formed on the blocking dielectric layer; and
    a tri-layered charge-trapping layer sandwiched between the tunnel dielectric layer and the blocking dielectric layer, the tri-layered charge-trapping layer further comprising:
        a bottom nitride layer formed on the substrate, the bottom nitride layer comprising silicon nitride (SiN) and silicon oxynitride (SiON), and SiN in the bottom nitride layer comprising a first SiN concentration;
        a top nitride layer, the top nitride layer comprising SiN and SiON, and SiN in the top nitride layer comprising a second SiN concentration; and
        a middle nitride layer, the middle nitride layer comprising at least SiN, and SiN in the middle nitride layer comprising a third SiN concentration, and the third SiN concentration being larger than the first SiN concentration and the second SiN concentration, wherein the top nitride layer, the middle nitride layer, and the bottom nitride layer combined together form a tri-layered charge-trapping layer, and the tri-layered charge-trapping layer is sandwiched between the tunnel dielectric layer and the blocking dielectric layer, wherein the top nitride layer is directly formed on the middle nitride layer, and the middle nitride layer is directly formed on the bottom nitride layer and is of a single material layer.

2. The semiconductor memory cell structure according to claim 1, wherein the tunnel dielectric layer and the blocking dielectric layer comprise silicon oxide.

3. The semiconductor memory cell structure according to claim 1, wherein the control gate comprises polysilicon.

4. The semiconductor memory cell structure according to claim 1, wherein the bottom nitride layer comprises a first thickness, the top nitride layer comprises a second thickness, the middle nitride layer comprises a third thickness, and the third thickness is larger than the first thickness and the second thickness.

5. The semiconductor memory cell structure according to claim 4, wherein the third thickness and a sum of the first thickness and the second thickness comprise a ratio, and the ratio is larger than 7:3.

6. The semiconductor memory cell structure according to claim 4, wherein the first thickness and the second thickness are the same.

7. The semiconductor memory cell structure according to claim 1, wherein the third SiN concentration is about 100%.

8. The semiconductor memory cell structure according to claim 1, wherein the first SiN concentration and the second SiN concentration are the same.

9. The semiconductor memory cell structure according to claim 8, wherein the first SiN concentration and the second SiN concentration are between 30% and 50%, and no material layer is disposed between the tri-layered charge trapping layer and the blocking dielectric layer.

10. The semiconductor memory cell structure according to claim 1, wherein the first SiN concentration is larger than the second SiN concentration, and no material layer is disposed between the tri-layered charge trapping layer and the blocking dielectric layer.

11. The semiconductor memory cell structure according to claim 10, wherein the first SiN concentration is larger than 50% and the second SiN concentration is between 30% and 50%.

12. The semiconductor memory cell structure according to claim 1, further comprising a source/drain region formed in the substrate.

13. The semiconductor memory cell structure according to claim 1, wherein a band gap of the middle nitride layer is lower than a maximum band gap of the top nitride layer and a maximum band gap of the bottom nitride layer, a band gap of the top nitride layer gradually decreases in a direction towards the middle nitride layer, and a band gap of the bottom nitride layer gradually decreases in a direction towards the middle nitride layer, wherein a first slope of the band gap profile for the bottom nitride layer is less than a second slope of the band gap profile for the top nitride layer, and a first maximum band gap value of the bottom nitride layer is less than a second maximum band gap value of the top nitride layer.

14. The semiconductor memory cell structure according to claim 1, wherein the top nitride layer and the bottom nitride layer are of hydrogenated derivatives of silicon nitride (SiN) and silicon oxynitride (SiON).

15. An oxide-nitride-oxide (ONO) structure for a semiconductor memory cell comprising:
    a tunnel oxide layer;
    a blocking oxide layer;
    a top nitride layer and a bottom nitride layer sandwiched between the tunnel oxide layer and the blocking oxide layer, the top nitride layer-comprising silicon nitride (SiN) and silicon oxynitride (SiON), and the bottom nitride layer comprising SiN and SiON; and
    a charge-trapping nitride layer sandwiched between the top nitride layer and the bottom nitride layer, the charge-trapping nitride comprising at least SiN, and a SiN concentration in the charge-trapping nitride layer being larger than SiN concentrations in the top nitride layer and the bottom nitride layer, wherein the top nitride layer, the charge-trapping nitride layer, and the bottom nitride layer combined together form a tri-layered charge-trapping layer, and the tri-layered charge-trapping layer is sandwiched between the tunnel oxide layer and the blocking oxide layer, wherein the top nitride layer is directly formed on the charge-trapping nitride layer, and the charge-trapping nitride layer is directly formed on the bottom nitride layer and is of a single material layer.

16. The ONO structure for the semiconductor memory cell according to claim 15, wherein the SiN concentrations of the top nitride layer and the bottom nitride layer are the same.

17. The ONO structure for the semiconductor memory cell according to claim 16, wherein the SiN concentrations of the top nitride layer and the bottom nitride layer are between 30% and 50%, no material layer is disposed between the tri-layered charge trapping layer and the blocking oxide layer.

18. The ONO structure for the semiconductor memory cell according to claim 15 wherein the SiN concentration of the bottom nitride layer is larger than the SiN concentration of the top nitride layer, no material layer is disposed between the tri-layered charge trapping layer and the blocking oxide layer.

19. The ONO structure for the semiconductor memory cell according to claim 18, wherein the SiN concentration of the bottom nitride layer is larger than 50%, and the SiN concentration of the top nitride layer is between 30% and 50%.

20. The ONO structure for the semiconductor memory cell according to claim 15, wherein a thickness of the charge-trapping nitride layer is larger than a thickness of the top nitride layer and a thickness of the bottom nitride layer.

21. The ONO structure for the semiconductor memory cell according to claim 20, wherein the thickness of the charge-trapping nitride layer and a sum of the thickness of the top nitride layer and the thickness of the bottom nitride layer comprise a ratio, and the ratio is larger than 7:3.

22. The ONO structure for the semiconductor memory cell according to claim 15, wherein a band gap of the charge-trapping nitride layer is lower than a maximum band gap of the top nitride layer and a maximum band gap of the bottom nitride layer, a band gap of the top nitride layer gradually decreases in a direction towards the charge-trapping nitride layer, and a band gap of the bottom nitride layer gradually decreases in a direction towards the charge-trapping nitride layer, wherein a first slope of the band gap profile for the bottom nitride layer is less than a second slope of the band gap profile for the top nitride layer, and a first maximum band gap value of the bottom nitride layer is less than a second maximum band gap value of the top nitride layer.

23. The ONO structure for the semiconductor memory cell according to claim 15, wherein the top nitride layer and the bottom nitride layer are of hydrogenated derivatives of silicon nitride (SiN) and silicon oxynitride (SiON).

\* \* \* \* \*